(12) United States Patent
Yamada (10) Patent No.: US 10,101,708 B2
(45) Date of Patent: Oct. 16, 2018

(54) ELECTRONIC TIMEPIECE AND DISPLAY CONTROL METHOD OF ELECTRONIC TIMEPIECE

(71) Applicant: SEIKO EPSON CORPORATION, Tokyo (JP)

(72) Inventor: Osami Yamada, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 28 days.

(21) Appl. No.: 15/361,864

(22) Filed: Nov. 28, 2016

(65) Prior Publication Data

US 2017/0160702 A1   Jun. 8, 2017

(30) Foreign Application Priority Data

Dec. 7, 2015   (JP) ................................ 2015-238810

(51) Int. Cl.
| | |
|---|---|
| *G04C 10/04* | (2006.01) |
| *G04C 15/00* | (2006.01) |
| *G04B 19/04* | (2006.01) |
| *G04B 19/08* | (2006.01) |
| *G01R 31/36* | (2006.01) |

(52) U.S. Cl.
CPC .......... *G04C 10/04* (2013.01); *G04B 19/048* (2013.01); *G04B 19/087* (2013.01); *G04C 15/0054* (2013.01); *G01R 31/3682* (2013.01)

(58) Field of Classification Search
CPC .. G04C 15/0054; G04C 10/04; G04B 19/025; G04B 19/048
See application file for complete search history.

(56) References Cited

U.S. PATENT DOCUMENTS

| | | | | |
|---|---|---|---|---|
| 5,959,941 | A * | 9/1999 | Murakami ................ | G04F 8/00 368/110 |
| 6,185,158 | B1 * | 2/2001 | Ito ..................... | G04C 17/0066 368/28 |
| 7,969,824 | B2 * | 6/2011 | Wiederrecht .......... | G04B 19/04 368/220 |
| 2004/0047244 | A1 * | 3/2004 | Iino ....................... | G04B 47/00 368/276 |

(Continued)

FOREIGN PATENT DOCUMENTS

| | | |
|---|---|---|
| JP | 2000-356690 A | 12/2000 |
| JP | 2016-031329 A | 3/2016 |

OTHER PUBLICATIONS

Men's Citizen Eco-Drive Endeavor Chronograph Divers Watch CA0444-50L, Mar. 22, 2015, retrieved on Jun. 7, 2018 from <https://www.nywatchstore.com/ca0444501.html>, full document.*

*Primary Examiner* — Amy Cohen Johnson
*Assistant Examiner* — Daniel Wicklund (57) ABSTRACT

An electronic timepiece includes a power generator that generates electric energy, a power storage that stores the electric energy, a capacity detector that detects remaining capacity of the power storage, an operation unit, an operation detector that detects a measurement display operation for instructing the operation unit to display a measurement time, and a capacity display operation for instructing the operation unit to display the remaining capacity, an indicating hand that is used in displaying the measurement time and the remaining capacity, a drive unit that drives the indicating hand, and displays the remaining capacity after moving the indicating hand so as to indicate a preset reference position.

6 Claims, 6 Drawing Sheets

(56) References Cited

U.S. PATENT DOCUMENTS

| | | | |
|---|---|---|---|
| 2005/0162982 A1* | 7/2005 | Suzuki | G04B 9/005 368/145 |
| 2006/0187758 A1* | 8/2006 | Takahashi | G04B 9/02 368/66 |
| 2010/0074059 A1* | 3/2010 | Hasumi | G04C 3/008 368/47 |
| 2011/0051561 A1* | 3/2011 | Fujisawa | G04G 5/002 368/47 |
| 2013/0077450 A1* | 3/2013 | Fleury | G04C 10/04 368/80 |
| 2014/0086026 A1* | 3/2014 | Mitani | G04R 60/12 368/278 |
| 2015/0117165 A1* | 4/2015 | Stotz | G04F 8/006 368/228 |
| 2015/0146503 A1* | 5/2015 | Nakanishi | G04R 20/02 368/21 |
| 2015/0311933 A1* | 10/2015 | Honda | G04R 20/04 455/140 |
| 2016/0033939 A1 | 2/2016 | Yamada | |
| 2016/0223991 A1* | 8/2016 | Kojima | G04B 19/247 |
| 2016/0223995 A1* | 8/2016 | Honda | G04R 20/02 |
| 2016/0259304 A1* | 9/2016 | Fujisawa | G04R 20/02 |
| 2017/0075309 A1* | 3/2017 | Minakuchi | G04C 3/146 |
| 2017/0277132 A1* | 9/2017 | Nozawa | G04C 10/04 |
| 2017/0277137 A1* | 9/2017 | Iijima | G04G 21/02 |
| 2017/0293268 A1* | 10/2017 | Fujisawa | G04R 60/12 |

\* cited by examiner

ELECTRONIC TIMEPIECE AND DISPLAY CONTROL METHOD OF ELECTRONIC TIMEPIECE

BACKGROUND

1. Technical Field

The present invention relates to an electronic timepiece which displays remaining capacity of a power storage, and a display control method of an electronic timepiece.

2. Related Art

In the related art, an electronic timepiece is known which includes a power storage, and which causes an indicating hand for displaying time information to display remaining capacity of the power storage (for example, JP-A-2000-356690).

The electronic timepiece in JP-A-2000-356690 includes a large-capacity capacitor. If an external input device is operated so as to switch the electronic timepiece to a power saving mode, a second hand is caused to move forward fast and to indicate a position corresponding to a charged voltage of the large-capacity capacitor. In this manner, the electronic timepiece displays an energy amount of the large-capacity capacitor.

The electronic timepiece in JP-A-2000-356690 employs the second hand in order to display the energy amount of the large-capacity capacitor. Consequently, the electronic timepiece cannot display a second in time information while the energy amount is displayed.

As a method of displaying the energy amount while the time information is displayed, for example, in a case where the electronic timepiece includes a chronograph hand for displaying a chronographic measurement time, it is conceivable to display the energy amount by using the chronograph hand.

In this case, it is desired that the electronic timepiece can comprehensibly display whether the chronograph hand displays the measurement time or the energy amount.

SUMMARY

An advantage of some aspects of the invention is to provide an electronic timepiece and a display control method of an electronic timepiece, in which remaining capacity of a power storage can be comprehensibly displayed by using an indicating hand for displaying a measurement time.

An electronic timepiece according to an aspect of the invention includes a power generator that generates electric energy, a power storage that stores the electric energy, a capacity detector that detects remaining capacity of the power storage, an operation unit, an operation detector that detects a measurement display operation for instructing the operation unit to display a measurement time, and a capacity display operation for instructing the operation unit to display the remaining capacity, an indicating hand that is used in displaying the measurement time and the remaining capacity, a drive unit that drives the indicating hand, and a display controller that controls the drive unit, and moves the indicating hand so as to display the measurement time, in a case where the measurement display operation is detected, that controls the drive unit, and displays the remaining capacity after moving the indicating hand so as to indicate a preset reference position, in a case where the capacity display operation is detected.

According to the aspect of the invention, if the operation unit is caused to perform the measurement display operation, the display controller moves the indicating hand so as to display the measurement time.

On the other hand, if the operation unit is caused to perform the capacity display operation, the display controller displays the remaining capacity after moving the indicating hand so as to indicate the preset reference position.

For example, the display controller moves the indicating hand to the reference position clockwise or counterclockwise. Thereafter, the display controller switches a rotation direction, and moves the indicating hand so as to display the remaining capacity. Alternatively, the display controller moves the indicating hand to the reference position clockwise or counterclockwise, and stops the indicating hand at the reference position for a fixed period of time. Thereafter, the display controller moves the indicating hand in the same rotation direction so as to display the remaining capacity. That is, causing the indicating hand to indicate the reference position means controlling the movement of the indicating hand so as to enable a user to recognize that the indicating hand indicates the reference position.

In this way, the movement of the indicating hand in a case of displaying the remaining capacity is different from the movement of the indicating hand in a case of displaying the measurement time. Accordingly, based on the movement of the indicating hand, the user can easily recognize that the indicating hand displays the remaining capacity.

In the electronic timepiece according to the aspect of the invention, it is preferable that in a case where the display controller causes the indicating hand to display the remaining capacity, the display controller displays the remaining capacity by moving the indicating hand clockwise after moving the indicating hand counterclockwise so as to indicate the reference position.

In a case where the indicating hand displays the measurement time, the indicating hand often moves clockwise. Accordingly, in a case where the indicating hand displays the remaining capacity, the indicating hand is moved to the reference position counterclockwise. In this manner, a user can more easily recognize that the indicating hand displays the remaining capacity rather than the measurement time.

It is preferable that the electronic timepiece according to the aspect of the invention further includes multiple indicating hands that display the measurement time, and the indicating hand which is movable fastest in the multiple indicating hands is used in displaying the remaining capacity.

For example, in a case where the electronic timepiece includes a chronograph second hand and a chronograph minute hand which display the measurement time, and where the chronograph second hand and the chronograph minute hand are driven by the common drive unit, the chronograph second hand is configured to move faster than the chronograph minute hand. In this case, the remaining capacity is displayed by the chronograph second hand. Therefore, compared to a case where the chronograph minute hand is used, it is possible to shorten a time from when the operation unit is caused to perform the capacity display operation until the remaining capacity is displayed.

In the electronic timepiece according to the aspect of the invention, it is preferable that the indicating hand is a chronograph second hand which revolves once in 60 seconds, and the display controller causes the indicating hand to indicate a position of 30 seconds as the reference position.

In the aspect of the invention with this configuration, the reference position is set to a position farthest from a zero second position. Therefore, a user can more easily recognize that the indicating hand indicates the reference position.

In the electronic timepiece according to the aspect of the invention, it is preferable that the display controller includes a reference signal generation circuit that generates a reference signal, an internal counter circuit that counts the reference signal, a hand position counter circuit that indicates a position of the indicating hand, and a coincidence determination circuit that causes the hand position counter circuit to perform counting, and that outputs a control signal for operating the indicating hand, in a case where a count value of the internal counter circuit and a count value of the hand position counter circuit do not coincide with each other, in a case where the measurement display operation is detected, the internal counter circuit is caused to count the reference signal, and the coincidence determination circuit is caused to output the control signal so as to move the indicating hand and to display the measurement time, in a case where the capacity display operation is detected, until the count value of the internal counter circuit reaches a reference value corresponding to the reference position, the internal counter circuit is caused to count the reference signal, and the coincidence determination circuit is caused to output the control signal so as to move the indicating hand and to indicate the reference position, after the count value of the internal counter circuit reaches the reference value, the count value of the internal counter circuit is set to a predetermined count value so as to cause the coincidence determination circuit to output the control signal and to move the indicating hand, and if the count value of the hand position counter circuit reaches a predetermined value corresponding to the remaining capacity, the coincidence determination circuit is caused to stop outputting the control signal so as to stop the indicating hand and to display the remaining capacity.

In the aspect of the invention with this configuration, if the operation unit is caused to perform the measurement display operation, the internal counter circuit counts the reference signal, and the coincidence determination circuit outputs the control signal so as to move the indicating hand and to display the measurement time.

If the operation unit is caused to perform the capacity display operation, until the count value of the internal counter circuit reaches the reference value corresponding to the reference position, the internal counter circuit counts the reference signal, and the coincidence determination circuit outputs the control signal so as to move the indicating hand and to indicate the reference position.

Then, if the count value of the internal counter circuit reaches the reference value, the count value of the internal counter circuit is set to the predetermined count value (for example, zero) so that the coincidence determination circuit outputs the control signal and the indicating hand is moved. Then, if the count value of the hand position counter circuit reaches the predetermined value corresponding to the remaining capacity, the coincidence determination circuit stops outputting the control signal so as to stop the indicating hand and to display the remaining capacity.

In this case, the measurement time and the remaining capacity can be displayed by using the internal counter circuit, the hand position counter circuit, and the coincidence determination circuit which are employed in common. Therefore, when the measurement time is displayed and the remaining capacity is displayed, compared to a case where a separate counter circuit is provided, a circuit scale of the electronic timepiece can be minimized.

A display control method of an electronic timepiece according to another aspect of the invention is a display control method of an electronic timepiece including a power generator that generates electric energy, a power storage that stores the electric energy, an operation unit, an indicating hand that is used in displaying a measurement time and remaining capacity of the power storage. The display control method includes detecting the remaining capacity, detecting a measurement display operation for instructing the operation unit to display the measurement time, detecting a capacity display operation for instructing the operation unit to display the remaining capacity, moving the indicating hand so as to display the measurement time, in a case where the measurement display operation is detected, and displaying the remaining capacity after moving the indicating hand so as to indicate a preset reference position, in a case where the capacity display operation is detected.

According to the aspects of the invention, based on the movement of the indicating hand, a user can easily recognize that the indicating hand indicates the remaining capacity.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment according to an aspect of the invention will be described with reference to the drawings.

Figure 1:
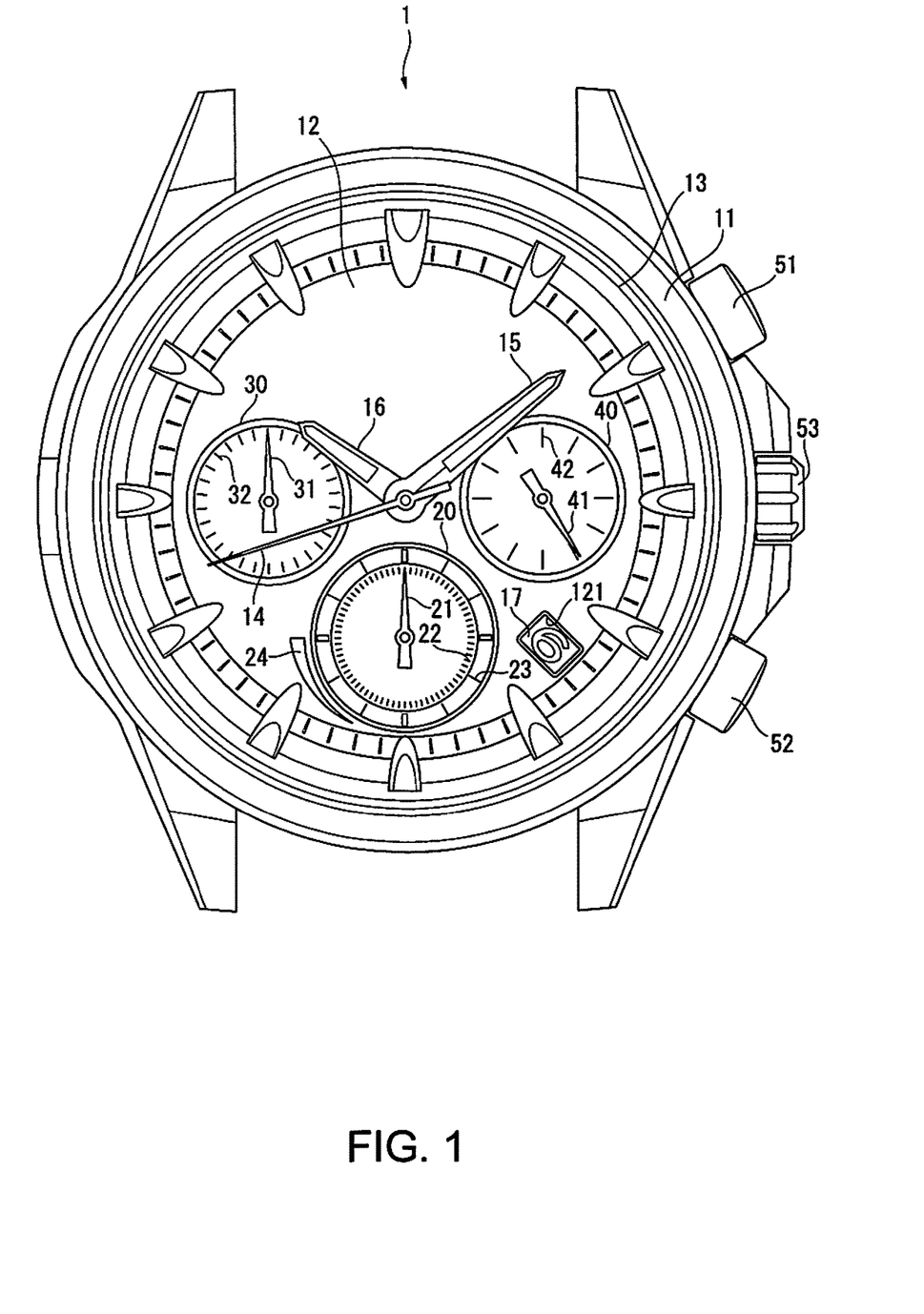
FIG. 1 is a front view illustrating an electronic timepiece according to an embodiment of the invention.

FIG. 1 is a front view illustrating an electronic timepiece 1.

The electronic timepiece 1 is a wristwatch worn on a user's wrist, and includes a cylindrical exterior case 11. In two openings of the exterior case 11, the opening on a front surface side is closed by a cover glass 13, and the opening on a rear surface side is closed by a rear cover (not illustrated).

A disc-shaped dial 12 is disposed on an inner peripheral side of the exterior case 11. When viewed from a timepiece front surface side in the dial 12, a first small circular window 20 is disposed at a position shifted from the center in a direction of 6 o'clock, a second small circular window 30 is disposed at a position shifted from the center in a direction of 9 o'clock, a third small circular window 40 is disposed at a position shifted from the center in a direction of 3 o'clock, and a small calendar window 121 is disposed at a position shifted from the center in an intermediate direction between 4 o'clock and 5 o'clock.

The electronic timepiece 1 includes a second hand 14, a minute hand 15, an hour hand 16, a 24-hour hand 41 which indicate time information, and a chronograph (CG) second hand 21 and a chronograph minute hand 31 which display a measurement time obtained by measuring a time.

In the indicating hands 14 to 16 and 41 which indicate the time information, the indicating hands 14 to 16 are arranged at the center of the dial 12, and the indicating hand 41 is arranged in the third small window 40. The respective indicating hands 14 to 16 and 41 are driven by a timepiece stepping motor (not illustrated) disposed on the rear cover side of the dial 12.

The CG second hand 21 is arranged in the first small window 20. A scale 22 which divides one circumference into 60 portions and a scale 23 which is arranged outside the scale 22 and which divides one circumference into 12 portions are marked on the outer periphery of the first small window 20. The CG second hand 21 indicates the scales 22 and 23 so as to display seconds of the measurement time.

Around the first small window 20, a crescent moon-shaped symbol 24 whose proximal end in a direction of 7 o'clock is narrow and whose distal end in a direction of 9 o'clock is wide is marked along the outer periphery of the first small window 20 in a range from the direction of 7 o'clock to the direction of 9 o'clock when viewed from a rotary axle of the CG second hand 21. The symbol 24 is a power indicator of a secondary battery 3 (refer to FIG. 2). The CG second hand 21 indicates any one of the proximal end (position of 35 seconds), the intermediate portion (position of 40 seconds), and the distal end (position of 45 seconds) of the symbol 24 so as to display remaining capacity of the secondary battery 3. That is, the CG second hand 21 also functions as an indicating hand for indicating an indicator.

That is, the CG second hand 21 is an example of the indicating hand used in displaying the measurement time and the remaining capacity according to an embodiment of the invention.

The CG minute hand 31 is arranged in the second small window 30. A scale 32 which divides one circumference into 30 portions is marked on the outer periphery of the second small window 30. The CG minute hand 31 displays minutes of the measurement time by indicating the scale 32. A maximum value of the amount which the CG minute hand 31 can display is 30 minutes.

The CG second hand 21 and the CG minute hand 31 are driven by a CG hand stepping motor 4 (refer to FIG. 2) disposed on the rear cover side of the dial 12. The CG hand stepping motor 4 is an example of a drive unit according to an embodiment of the invention. The CG second hand 21 revolves once using 60 steps, and the CG minute hand 31 revolves once using 1,800 steps. That is, when the measurement time is displayed, the CG second hand 21 revolves once in 60 seconds, and the CG minute hand 31 revolves once in 30 minutes.

A calendar indicator (date indicator) 17 is arranged on the rear cover side of the dial 12. The calendar indicator 17 is visible through the small calendar window 121.

On a side surface of the exterior case 11, from the center of the dial 12, an A-button 51 is disposed at a position in the direction of 2 o'clock, a B-button 52 is disposed at a position in the direction of 4 o'clock, and a crown 53 is disposed at a position in the direction of 3 o'clock. The A-button 51, the B-button 52, and the crown 53 are operated so as to perform inputting in accordance with the operation. The crown 53 is configured to be pullable two stages from a state where the crown 53 is pushed toward the timepiece center.

Here, the A-button 51, the B-button 52, and the crown 53 are an example of an operation unit according to an embodiment of the invention.

Figure 2:
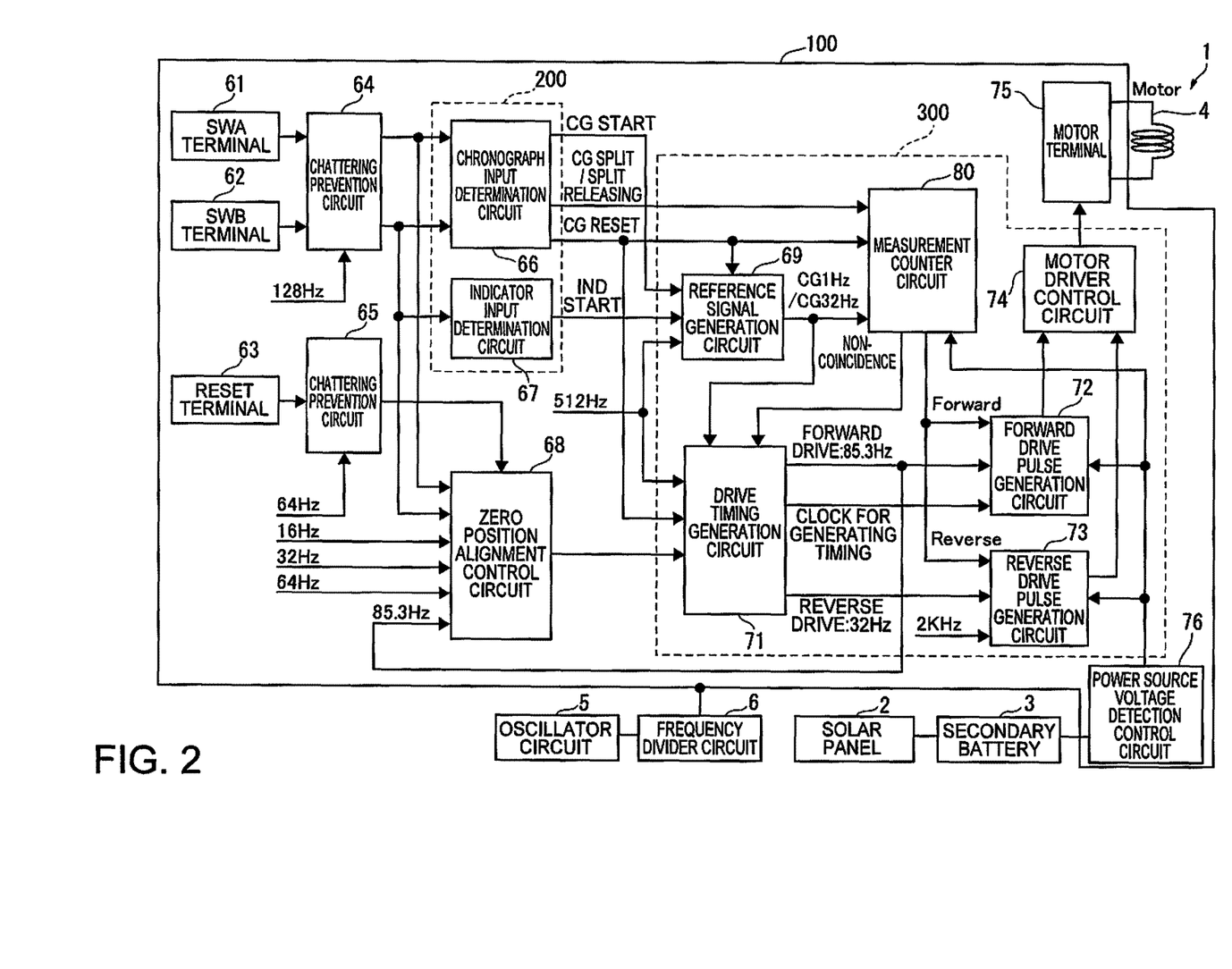
FIG. 2 is a view illustrating a schematic configuration of the electronic timepiece according to the embodiment.

FIG. 2 is a view illustrating a schematic configuration of the electronic timepiece 1.

FIG. 2 illustrates a configuration for driving the CG second hand 21 and the CG minute hand 31. A configuration for driving the second hand 14, the minute hand 15, the hour hand 16, and the 24-hour hand 41 is omitted in the illustration.

The electronic timepiece 1 includes a control circuit 100, a solar panel 2 serving as a power generator, the secondary battery 3 serving as a power storage, the CG hand stepping motor 4, an oscillator circuit 5, and a frequency divider circuit 6.

The solar panel 2 generates electric energy if light is received.

The secondary battery 3 stores the electric energy generated by the solar panel 2.

The CG hand stepping motor 4 is a single motor, and drives the CG second hand 21 and the CG minute hand 31.

The oscillator circuit 5 includes a crystal oscillator, and outputs a signal having a predetermined frequency such as 32.768 kHz.

The frequency divider circuit 6 divides the signal output from the oscillator circuit 5, and outputs the signal to the control circuit 100.

The control circuit 100 includes an SWA terminal 61, an SWB terminal 62, a RESET terminal 63, chattering prevention circuits 64 and 65, a chronograph input determination circuit 66, an indicator input determination circuit 67, a zero position alignment control circuit 68, a reference signal generation circuit 69, a measurement counter circuit 80, a drive timing generation circuit 71, a forward drive pulse generation circuit 72, a reverse drive pulse generation circuit 73, a motor driver control circuit 74, a motor terminal 75, and a power source voltage detection control circuit 76.

If the A-button 51 is pressed, a detection signal is input to the SWA terminal 61.

If the B-button 52 is pressed, a detection signal is input to the SWB terminal 62.

If the crown 53 is pulled two stages, a detection signal is input to the RESET terminal 63.

The chattering prevention circuit 64 removes chattering from the detection signals input to the SWA terminal 61 and the SWB terminal 62 by performing sampling using a clock signal of 128 Hz which is output from the frequency divider circuit 6. The chattering prevention circuit 64 outputs the signals to the chronograph input determination circuit 66, the indicator input determination circuit 67, and the zero position alignment control circuit 68.

The chattering prevention circuit 65 removes chattering from the detection signal input to the RESET terminal 63 by performing sampling using a clock signal of 64 Hz which is output from the frequency divider circuit 6. The chattering prevention circuit 65 outputs the signal to the zero position alignment control circuit 68.

Based on the detection signals (detection signals input to the SWA terminal 61 and the SWB terminal 62) output from the chattering prevention circuit 64, the chronograph input determination circuit 66 determines an operation of the A-button 51 and the B-button 52, and outputs an operation signal in accordance with the operation.

Specifically, a CG start signal which instructs a chronograph (time measurement) to start is output to the reference signal generation circuit 69.

A CG split signal which instructs measurement of a split time and a CG split releasing signal which instructs releasing the measurement of the split time are output to the measurement counter circuit 80.

A CG reset signal which instructs resetting the chronograph is output to the reference signal generation circuit 69, the measurement counter circuit 80, and the drive timing generation circuit 71.

Based on the detection signal (detection signal input to the SWB terminal 62) output from the chattering prevention circuit 64, the indicator input determination circuit 67 determines an operation of the B-button 52, and outputs an operation signal in accordance with the operation.

Specifically, an IND start signal which instructs start to display (indicator display) of the remaining capacity of the secondary battery 3 is output to the reference signal generation circuit 69.

Here, the chronograph input determination circuit 66 and the indicator input determination circuit 67 configure an operation detector 200.

Based on the detection signal (detection signal input to the SWA terminal 61) output from the chattering prevention circuit 64 and the detection signal output from the chattering prevention circuit 65, the zero position alignment control circuit 68 determines an operation of the A-button 51 and the crown 53, and outputs the signal in accordance with the operation to the drive timing generation circuit 71.

Specifically, if the A-button 51 is pressed (single press) in a state where the crown 53 is pulled two stages, a one pulse signal is output to the drive timing generation circuit 71. In this manner, the CG secondhand 21 and the CG minute hand 31 can be operated as much as one step.

If the A-button 51 is pressed for a longtime in the state where the crown 53 is pulled two stages, a clock signal is output to the drive timing generation circuit 71. In this case, frequencies of the clock signal are increased stepwise to 16 Hz, 32 Hz, 64 Hz, and 85.3 Hz, and the clock signal is output to the drive timing generation circuit 71. In this manner, the CG second hand 21 and the CG minute hand 31 are enabled to move forward fast while being accelerated. The clock signals of 16 Hz, 32 Hz, and 64 Hz are supplied from the frequency divider circuit 6, and the clock signal of 85.3 Hz is supplied from the drive timing generation circuit 71.

The clock signal of 512 Hz which is output from the frequency divider circuit 6 is input to the reference signal generation circuit 69. Then, if the CG start signal is input, the reference signal generation circuit 69 generates the clock signal of 1 Hz, based on the clock signal of 512 Hz. If the IND start signal is input, the reference signal generation circuit 69 generates the clock signal of 32 Hz, based on the clock signal of 512 Hz. Then, the generated clock signals are output to the measurement counter circuit 80 and the drive timing generation circuit 71.

If the CG reset signal is input, the reference signal generation circuit 69 completes the generation of the clock signals.

Figure 3:
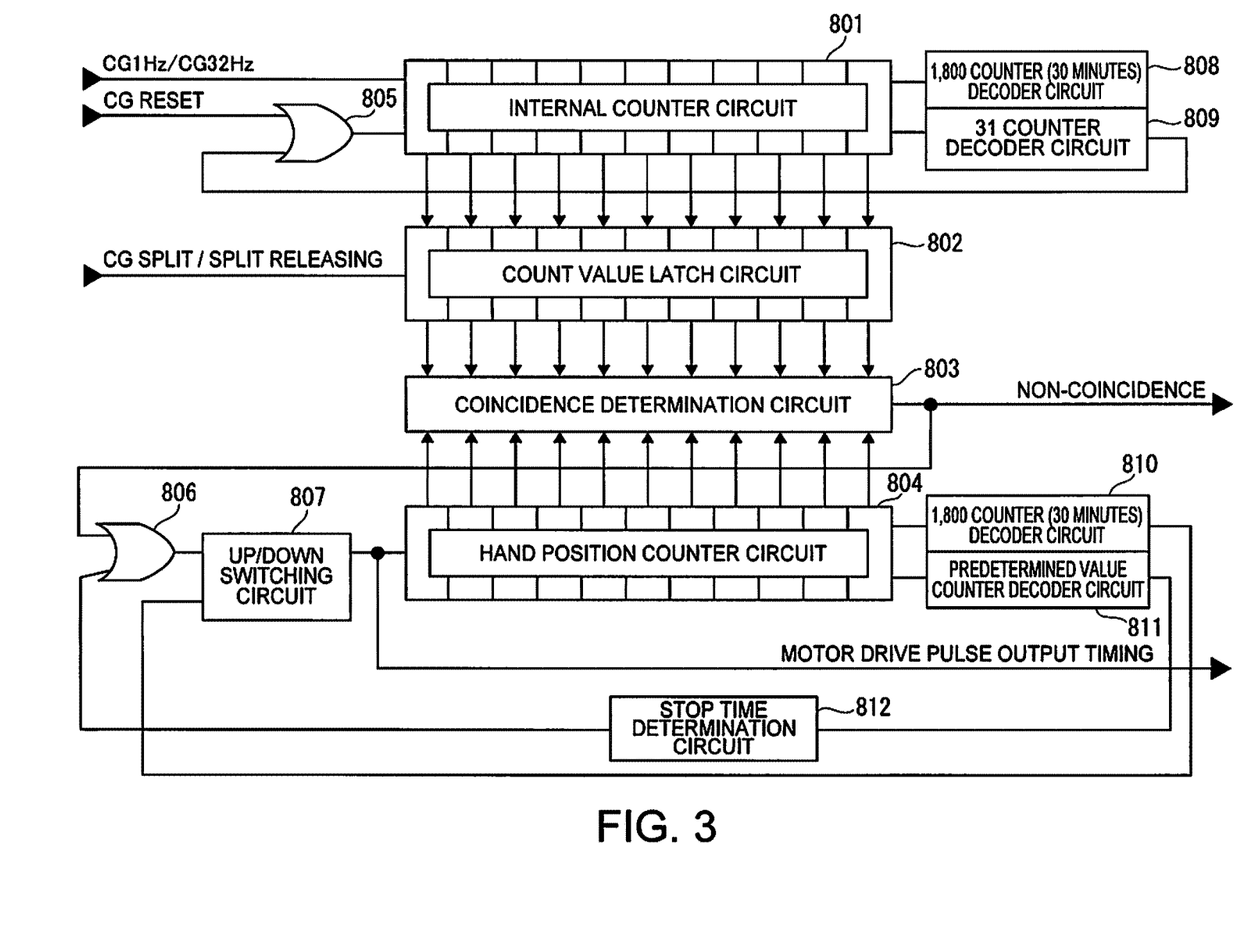
FIG. 3 is a view illustrating a measurement counter circuit according to the embodiment.

FIG. 3 is a view illustrating the measurement counter circuit 80.

The measurement counter circuit 80 includes an internal counter circuit 801, a count value latch circuit 802, a coincidence determination circuit 803, a hand position counter circuit 804, OR circuits 805 and 806, an up/down switching circuit 807, 1,800 counter decoder circuits 808 and 810, a 31 counter decoder circuit 809, a predetermined value counter decoder circuit 811, and a stop time determination circuit 812.

The internal counter circuit 801 counts the clock signal of 1 Hz or 32 Hz which is output from the reference signal generation circuit 69. The internal counter circuit 801 is configured to include a flip-flop circuit of 11 stages, and is configured to be capable of counting at least 1,800.

The 1,800 counter decoder circuit 808 decodes an output signal of the internal counter circuit 801, and detects a count value.

The 31 counter decoder circuit 809 is operated in a case where an indicator display process (to be described later) is performed, and decodes the output signal of the internal counter circuit 801. If it is detected that the count value reaches 31, the 31 counter decoder circuit 809 outputs the detection signal (H-level signal) to the OR circuit 805 and the up/down switching circuit 807.

The CG reset signal (H-level signal) output from the chronograph input determination circuit 66 and the detection signal (H-level signal) output from the 31 counter decoder circuit 809 are input to the OR circuit 805. Then, if anyone of the CG reset signal and the detection signal is input, the OR circuit 805 outputs a clear signal which clears the count value of the internal counter circuit 801 to zero, to the internal counter circuit 801.

The count value latch circuit 802 is configured to include a flip-flop circuit of 11 stages. Each time the internal counter circuit 801 counts the clock signal, the count value latch circuit 802 updates the held count value so as to be the same value as the count value of the internal counter circuit 801, and holds the updated count value.

Here, if the CG split signal is input from the chronograph input determination circuit 66, the count value latch circuit 802 continues to hold the count value without updating the count value. Then, if the CG split releasing signal is input from the chronograph input determination circuit 66 in this state, the count value latch circuit 802 restarts to update the count value.

The coincidence determination circuit 803 compares the count value of the count value latch circuit 802, that is, the count value of the internal counter circuit 801, with the count value of the hand position counter circuit 804 (to be described later), and determines whether or not both of these coincide with each other. Then, in a case where both of these do not coincide with each other, the coincidence determination circuit 803 outputs a non-coincidence signal (H-level signal) which is a one pulse signal to an OR circuit 806 and the drive timing generation circuit 71. Here, the non-coincidence signal is an example of a control signal according to an embodiment of the invention.

In a case where a stop signal (H-level signal) which stops counting of the hand position counter circuit 804 is not input from the stop time determination circuit 812 (to be described later), if a non-coincidence signal (H-level signal) which is the one pulse signal is input from the coincidence determination circuit 803, the OR circuit 806 outputs the one pulse signal to the up/down switching circuit 807.

Each time the one pulse signal is input from the OR circuit 806, the up/down switching circuit 807 outputs the one pulse signal to the hand position counter circuit 804, the forward drive pulse generation circuit 72, and the reverse drive pulse generation circuit 73. In accordance with the detection signal output from the 31 counter decoder circuit 809 and the count value of the 1,800 counter decoder circuit 810 (to be described later), the up/down switching circuit 807 switches a count method of the hand position counter circuit 804 to count-up or count-down.

The hand position counter circuit 804 counts pulses output from the up/down switching circuit 807. The hand position counter circuit 804 is configured to include a flip-flop circuit of 11 stages, and is configured to be capable of counting at least 1,800.

The 1,800 counter decoder circuit 810 decodes the output signal of the hand position counter circuit 804, detects the count value, and outputs the detected count value to the up/down switching circuit 807.

In the indicator display process (to be described later), the predetermined value counter decoder circuit 811 is operated after the CG secondhand 21 indicates a reference position, and decodes the output signal of the hand position counter circuit 804. If it is detected that the count value reaches a predetermined value, the predetermined value counter decoder circuit 811 outputs the detection signal to the stop time determination circuit 812.

Here, the predetermined value is set to any one of 25, 20, and 15 depending on the remaining capacity of the secondary battery 3 by the power source voltage detection control circuit 76 (to be described later).

The stop time determination circuit 812 measures an elapsed time from when the IND start signal is output from the indicator input determination circuit 67.

If the detection signal is output from the predetermined value counter decoder circuit 811, the stop time determination circuit 812 outputs a stop signal (H-level signal) which stops counting of the hand position counter circuit 804 to the OR circuit 806. Then, if the elapsed time reaches a predetermined time (4 seconds) after the stop signal is output, the stop time determination circuit 812 stops outputting the stop signal.

A detailed operation of the measurement counter circuit 80 will be described later.

Referring back to FIG. 2, based on the clock signal of 512 Hz which is output from the frequency divider circuit 6, the clock signal output from the zero position alignment control circuit 68, and the non-coincidence signal output from the measurement counter circuit 80, the drive timing generation circuit 71 generates a forward rotating clock signal, a timing generating clock signal, and a reverse rotating clock signal.

The drive timing generation circuit 71 includes a switching circuit which switches a rotation direction of the CG second hand 21 to forward rotation (clockwise) or reverse rotation (counterclockwise) in accordance with the CG reset signal or the clock signal output from the reference signal generation circuit 69.

In a case where the rotation direction is set to the forward rotation by the switching circuit, the drive timing generation circuit 71 generates the forward rotating clock signal and the timing generating clock signal, and outputs the signals to the forward drive pulse generation circuit 72. The frequency of the forward rotating clock signal in a case where the indicator display is performed is 85.3 Hz.

In a case where the rotation direction is set to the reverse rotation by the switching circuit, the drive timing generation circuit 71 generates the reverse rotating clock signal, and outputs the signal to the reverse drive pulse generation circuit 73. The frequency of the reverse rotating clock signal in a case where the indicator display is performed is 32 Hz.

Based on the forward rotating clock signal and the timing generating clock signal which are output from the drive timing generation circuit 71, the forward drive pulse generation circuit 72 generates a forward rotating motor drive pulse. Each time the one pulse signal is input from the up/down switching circuit 807 of the measurement counter circuit 80, the forward drive pulse generation circuit 72 outputs the motor drive pulse which causes the CG hand stepping motor 4 to rotate forward as much as one step, to the motor driver control circuit 74.

Based on the reverse rotating clock signal output from the drive timing generation circuit 71 and the clock signal of 2 KHz which is output from the frequency divider circuit 6, the reverse drive pulse generation circuit 73 generates a reverse rotating motor drive pulse. Each time the one pulse signal is input from the up/down switching circuit 807 of the measurement counter circuit 80, the reverse drive pulse generation circuit 73 outputs the motor drive pulse which causes the CG hand stepping motor 4 to rotate reversely as much as one step, to the motor driver control circuit 74.

The motor driver control circuit 74 outputs the motor drive pulse output from the forward drive pulse generation circuit 72 and the reverse drive pulse generation circuit 73 to the motor terminal 75 so as to drive the CG hand stepping motor 4.

The power source voltage detection control circuit 76 is an example of a capacity detector according to an embodiment of the invention, and detects the remaining capacity of the secondary battery 3. In accordance with the detected remaining capacity, the power source voltage detection control circuit 76 sets the predetermined value of the predetermined value counter decoder circuit 811 included in the measurement counter circuit 80 to any one of 25, 20, and 15. Specifically, in a case where the remaining capacity is insufficient, the power source voltage detection control circuit 76 sets the predetermined value to 25. In a case where the remaining capacity is in an intermediate level, the power source voltage detection control circuit 76 sets the predetermined value to 20. In a case where the remaining capacity is sufficient, the power source voltage detection control circuit 76 sets the predetermined value to 15.

In a case where a battery voltage of the secondary battery 3 is lowered, the power source voltage detection control circuit 76 changes a hand operation cycle of the second hand 14 so as to be different from a normal hand operation cycle. The electronic timepiece 1 can display that the battery voltage is lowered. This function is referred to as a battery low display (BLD) function.

Here, the reference signal generation circuit 69, the measurement counter circuit 80, the drive timing generation circuit 71, the forward drive pulse generation circuit 72, the reverse drive pulse generation circuit 73, the motor driver control circuit 74 configure a display controller 300.

Indicator Display Process

Next, an indicator display process will be described in which the CG second hand 21 is caused to indicate the symbol 24 so as to display the remaining capacity of the secondary battery 3.

Figure 4:
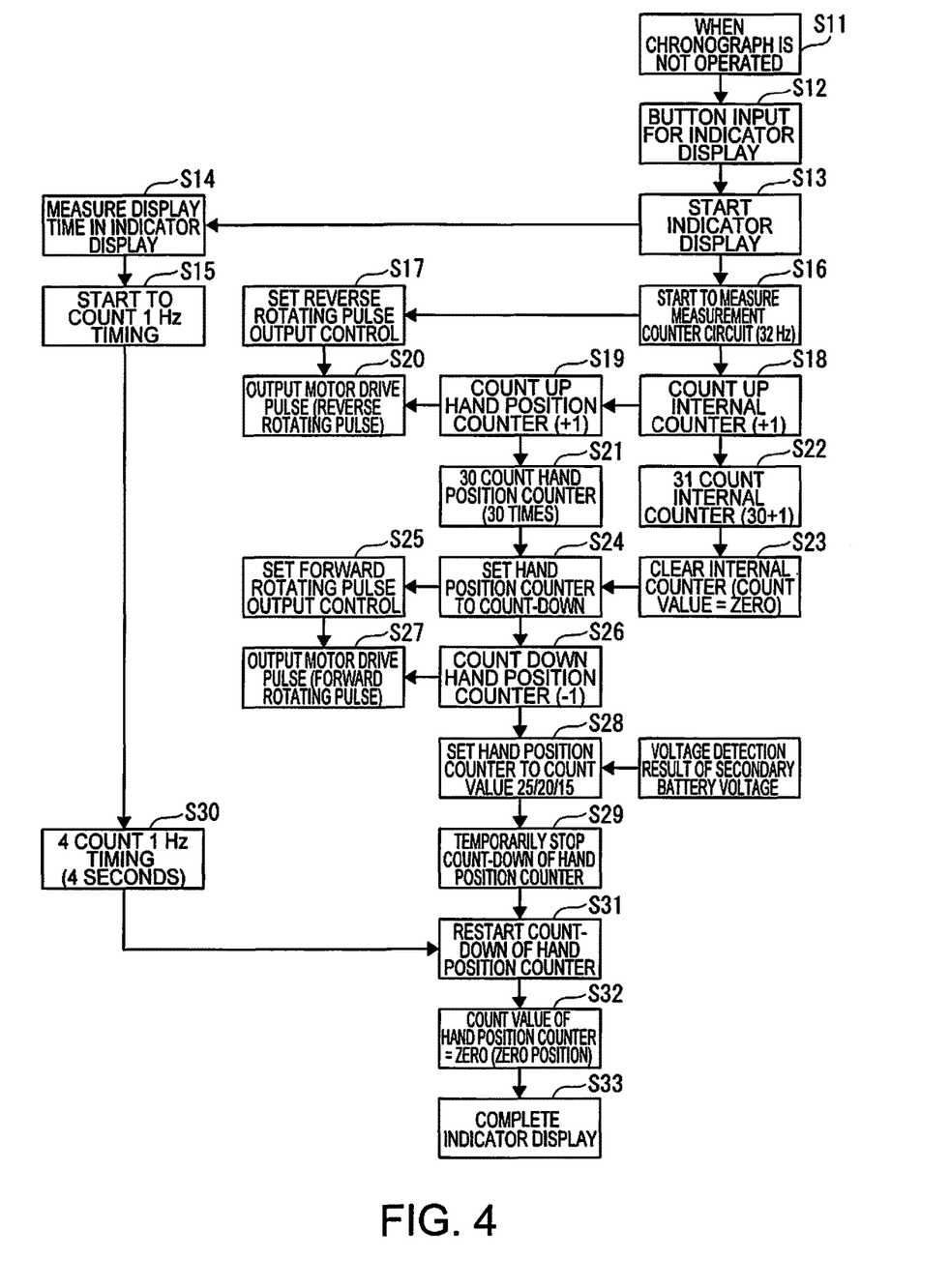
FIG. 4 is a view illustrating an indicator display process according to the embodiment.
Figure 5:
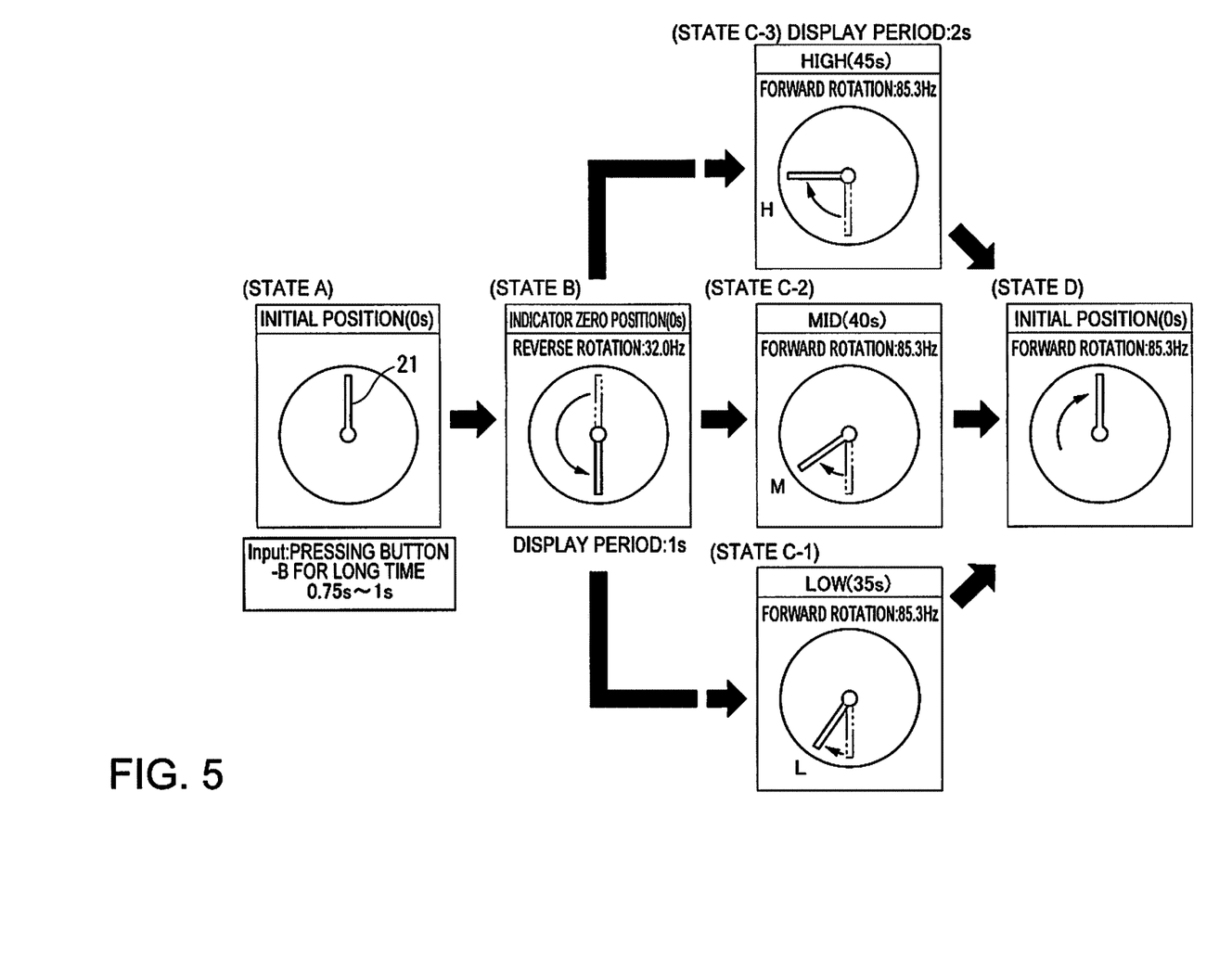
FIG. 5 is a view illustrating transition of an indicating position of a CG second hand according to the embodiment.

FIG. 4 is a view illustrating the indicator display process. FIG. 5 is a view illustrating transition of an indicating position of the CG second hand 21. Hereinafter, in FIG. 4, description will be made with reference to FIGS. 2, 3, and 5.

When the chronograph is not operated, as illustrated in a state A in FIG. 5, the CG second hand 21 indicates a zero second position as an initial position (S11). At this time, the count value of the internal counter circuit 801 of the measurement counter circuit 80, the count value latch circuit 802, and the hand position counter circuit 804 is set to zero.

In this state, the B-button 52 is pressed for a long time (0.75 to one second). If a capacity display operation for instructing display (indicator display) of the remaining capacity is performed (S12), the indicator input determination circuit 67 detects the capacity display operation, and outputs the IND start signal so as to start the indicator display process (S13). When the chronograph is operated, even if the B-button 52 is pressed for a long time, the indicator display process does not start.

If the indicator display process starts, the stop time determination circuit 812 of the measurement counter circuit 80 starts to measure a display time (S14), and starts to count the clock signal of 1 Hz (S15).

If the indicator display process starts and the IND start signal is output from the indicator input determination circuit 67, the reference signal generation circuit 69 generates and outputs the clock signal of 32 Hz. In this manner, the clock signal of 32 Hz is input to the internal counter circuit 801 of the measurement counter circuit 80, and the measurement counter circuit 80 starts to count the clock signal (S16).

If the clock signal of 32 Hz is output from the reference signal generation circuit 69, the drive timing generation circuit 71 switches the rotation direction of the CG second hand 21 to the reverse rotation. In this manner, setting is performed so that the reverse rotating motor drive pulse is output from the reverse drive pulse generation circuit 73 (S17). Then, the drive timing generation circuit 71 generates the reverse rotating clock signal of 32 Hz, and outputs the clock signal to the reverse drive pulse generation circuit 73.

If the internal counter circuit 801 counts up one increment (S18), a value held by the count value latch circuit 802 becomes 1. At this time, the count value of the hand position counter circuit 804 is zero. Accordingly, the value held by the count value latch circuit 802 does not coincide with the count value of the hand position counter circuit 804. A non-coincidence signal of one pulse is output from the coincidence determination circuit 803.

In this manner, the one pulse signal is output from the OR circuit 806, and the one pulse signal is output from the up/down switching circuit 807. Here, a count method of the hand position counter circuit 804 is set to count-up. Accordingly, if the one pulse signal is output from the up/down switching circuit 807, the hand position counter circuit 804 counts up one increment (S19).

If the one pulse signal is output from the up/down switching circuit 807, the reverse drive pulse generation circuit 73 outputs the reverse rotating motor drive pulse (S20). In this manner, the CG second hand 21 moves counterclockwise as much as one step (one second).

Thereafter, each time the internal counter circuit 801 counts up one increment, the non-coincidence signal is output from the coincidence determination circuit 803, and the one pulse signal is output from the up/down switching circuit 807. Then, each time the one pulse signal is output from the up/down switching circuit 807, the hand position counter circuit 804 counts up one increment, and the CG second hand 21 moves counterclockwise as much as one step.

Then, if the count value of the internal counter circuit 801 reaches 30 which is a reference value, the count value of the hand position counter circuit 804 also reaches 30 (S21). As illustrated in a state B in FIG. 5, the CG second hand 21 indicates a position of 30 seconds as a reference position. A time from when the CG second hand 21 starts to move from the zero second position until the CG second hand 21 indicates the position of 30 seconds is approximately one second ($\approx$30 steps=32 Hz).

Then, if the internal counter circuit 801 counts up one increment and the count value reaches 31 (S22), the 31 counter decoder circuit 809 outputs the detection signal. In this manner, a clear signal is output from the OR circuit 805. The count value of the internal counter circuit 801 is cleared to zero, and the internal counter circuit 801 stops counting the clock signal (S23).

If the 31 counter decoder circuit 809 outputs the detection signal, the up/down switching circuit 807 sets the count method of the hand position counter circuit 804 to count-down (S24).

If the clear signal is output from the OR circuit 805, the drive timing generation circuit 71 switches the rotation direction of the CG second hand 21 to the forward rotation. In this manner, setting is performed so that the forward rotating motor drive pulse is output from the forward drive pulse generation circuit 72 (S25). Then, the drive timing generation circuit 71 generates the forward rotating clock signal of 85.3 Hz and the timing generating clock signal, and outputs the clock signals to the forward drive pulse generation circuit 72.

If the count value of the internal counter circuit 801 is cleared to zero, a value held by the count value latch circuit 802 also becomes zero. At this time, the count value of the hand position counter circuit 804 is 30. Accordingly, the value held by the count value latch circuit 802, that is, the count value of the internal counter circuit 801 does not coincide with the count value of the hand position counter circuit 804. A non-coincidence signal is output from the coincidence determination circuit 803.

In this manner, the one pulse signal is output from the OR circuit 806, and the one pulse signal is output from the up/down switching circuit 807. Then, the hand position counter circuit 804 count down one decrement (S26).

If the one pulse signal is output from the up/down switching circuit 807, the forward drive pulse generation circuit 72 outputs the forward rotating motor drive pulse (S27). In this manner, the CG second hand 21 moves clockwise as much as one step (one second) from the position of 30 seconds which is the reference position.

Thereafter, the coincidence determination circuit 803 outputs the non-coincidence signal until the count value of the hand position counter circuit 804 reaches zero. At this time, the coincidence determination circuit 803 outputs the non-coincidence signal at an interval of 1/85.3 seconds. Therefore, the CG second hand 21 moves clockwise one step by one step in every 1/85.3 seconds. Then, each time the non-coincidence signal is output from the coincidence determination circuit 803, the hand position counter circuit 804 count down one decrement.

Here, the predetermined value of the predetermined value counter decoder circuit 811 is set to any one of 25, 20, and 15 in advance by the power source voltage detection control circuit 76, depending on the remaining capacity of the secondary battery 3. Specifically, the predetermined value is set to 25 in a case where the remaining capacity is insufficient (case of short duration). The predetermined value is set to 20 in a case where the remaining capacity is in the intermediate level (case of intermediate duration). The predetermined value is set to 15 in a case where the remaining capacity is sufficient (case of enough duration). The power source voltage detection control circuit 76 determines the remaining capacity, based on the detection result of the battery voltage of the secondary battery 3.

Then, if the hand position counter circuit 804 continuously counts down and the count value reaches the predetermined value (S28), the predetermined value counter decoder circuit 811 outputs the detection signal. Then, the stop time determination circuit 812 outputs a stop signal to the OR circuit 806.

While the stop signal is input, the OR circuit 806 does not output the pulse signal, even in a case where the non-coincidence signal is input. Therefore, the hand position counter circuit 804 temporarily stops count-down (S29).

That is, in a case where the remaining capacity is insufficient and the predetermined value is set to 25, the hand position counter circuit 804 stops count-down if the count value reaches 25. At this time, as illustrated in a state C-1 in FIG. 5, the CG second hand 21 stops in a state of indicating the position of 35 seconds, and displays that the remaining capacity is insufficient (L).

In a case where the remaining capacity is in the intermediate level and the predetermined value is set to 20, the hand position counter circuit 804 stops count-down if the count value reaches 20. At this time, as illustrated in a state C-2 in FIG. 5, the CG second hand 21 stops in a state of indicating the position of 40 seconds, and displays that the remaining capacity is in the intermediate level (MID).

In a case where the remaining capacity is sufficient and the predetermined value is set to 15, the hand position counter circuit 804 stops count-down if the count value reaches 15. At this time, as illustrated in a state C-3 in FIG. 5, the CG second hand 21 stops in a state of indicating the position of 45 seconds, and displays that the remaining capacity is sufficient (H).

Thereafter, if the count value of the clock signal of 1 Hz which is counted by the stop time determination circuit 812 reaches 4 and the elapsed time from when the indicator display process starts reaches 4 seconds (S30), the stop time determination circuit 812 stops outputting the stop signal. In this manner, each time the non-coincidence signal is input, the OR circuit 806 outputs the one pulse signal. The CG second hand 21 restarts to move, and the hand position counter circuit 804 restarts count-down (S31). That is, the CG second hand 21 restarts to move clockwise after indicating a position corresponding to the remaining capacity for approximately 2 seconds.

Then, if the count value of the hand position counter circuit 804 reaches zero, the non-coincidence signal is no longer output from the coincidence determination circuit 803. Accordingly, as illustrated in a state D in FIG. 5, the CG second hand 21 stops at the zero second position, and the hand position counter circuit 804 completes count-down (S32). In this manner, the indicator display process is completed (S33).

Measurement Time Display Process

Next, a measurement time display process will be described in which the CG second hand 21 and the CG minute hand 31 are caused to display a measurement time.

Figure 6:
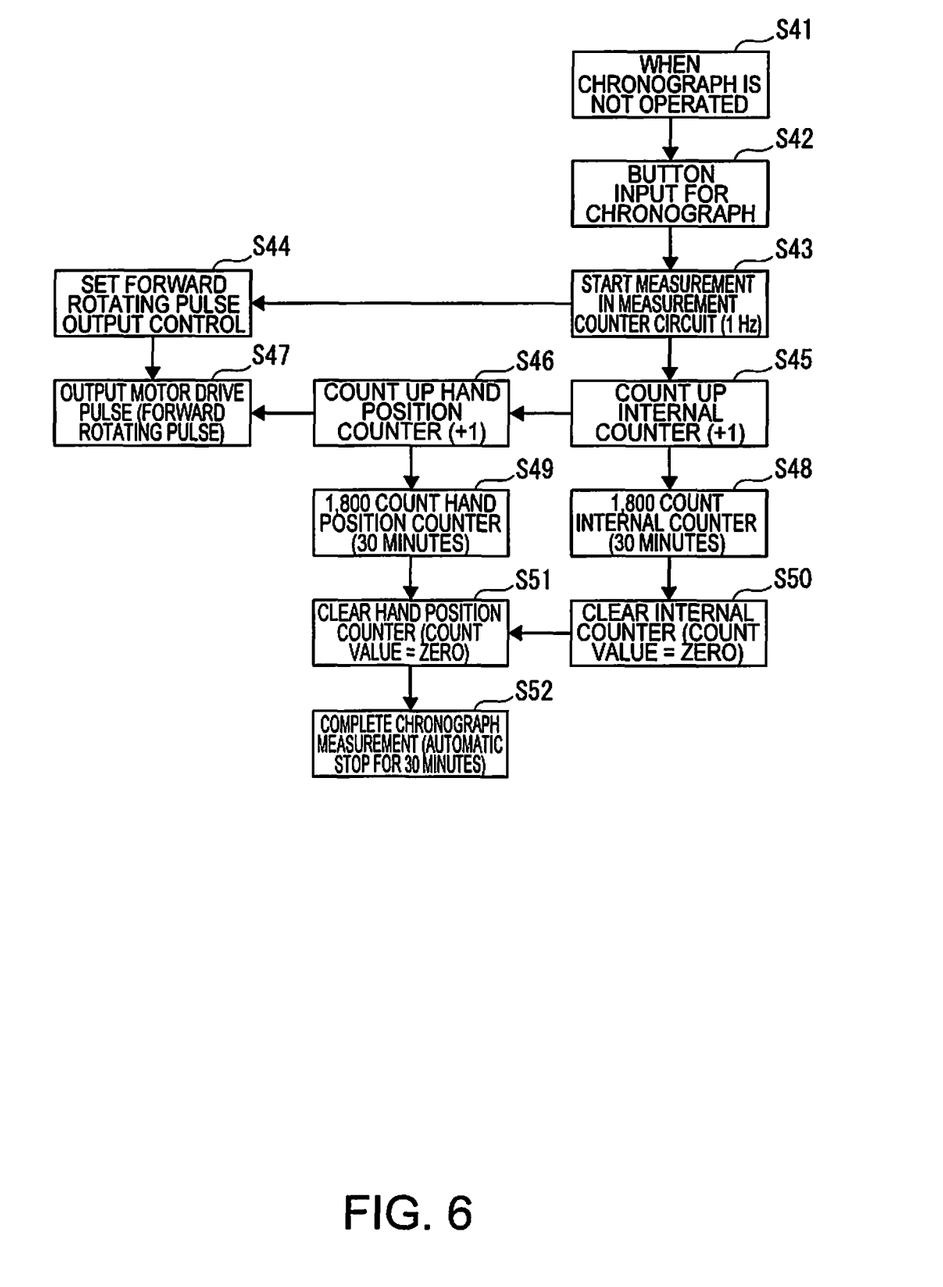
FIG. 6 is a view illustrating a measurement time display process according to the embodiment.

FIG. 6 is a view illustrating the measurement time display process.

When the chronograph is not operated, the CG second hand 21 indicates the zero second position as the initial position, and the CG minute hand 31 indicates a zero minute position as the initial position (S41).

In this state, if the A-button 51 is pressed and a measurement display operation for instructing displaying the measurement time is performed, the chronograph input determination circuit 66 detects the measurement display operation, and outputs a CG start signal (S42).

If the CG start signal is output, the reference signal generation circuit 69 generates and outputs the clock signal of 1 Hz. In this manner, the clock signal of 1 Hz is input to the internal counter circuit 801 of the measurement counter circuit 80, and the measurement counter circuit 80 starts to count the clock signal (S43).

If the clock signal of 1 Hz is output from the reference signal generation circuit 69, the drive timing generation circuit 71 sets the rotation direction of the CG secondhand 21 to the forward rotation. In this manner, setting is performed so that the forward rotating motor drive pulse is output from the forward drive pulse generation circuit 72 (S44). Then, the drive timing generation circuit 71 generates the forward rotating clock signal of 1 Hz, and outputs the clock signal to the forward drive pulse generation circuit 72.

If the internal counter circuit 801 counts up one increment (S45), the non-coincidence signal of one pulse is output from the coincidence determination circuit 803.

In this manner, the one pulse signal is output from the OR circuit 806, and the one pulse signal is output from the up/down switching circuit 807. Here, a count method of the hand position counter circuit 804 is set to count-up. Accordingly, if the one pulse signal is output from the up/down switching circuit 807, the hand position counter circuit 804 counts up one increment (S46).

If the one pulse signal is output from the up/down switching circuit 807, the forward drive pulse generation circuit 72 outputs the forward rotating motor drive pulse (S47). In this manner, the CG second hand 21 and the CG minute hand 31 move clockwise as much as one step (one second).

Thereafter, each time the internal counter circuit 801 counts up one increment, the non-coincidence signal is output from the coincidence determination circuit 803, and the one pulse signal is output from the up/down switching circuit 807. Then, each time the one pulse signal is output from the up/down switching circuit 807, the hand position counter circuit 804 counts up one increment of the count value, and the CG second hand 21 and the CG minute hand 31 move clockwise as much as one step. In this manner, the CG second hand 21 moves as much as one step per one second, and then, displays the measurement time.

Then, if 30 minutes elapses and the count value of the internal counter circuit 801 reaches 1,800 (S48), the count value of the hand position counter circuit 804 also reaches 1,800 (S49). At this time, the CG second hand 21 indicates the zero second position, and the CG minute hand 31 indicates the zero minute position.

Then, if the internal counter circuit 801 counts up one increment in this state, the count value of the internal counter circuit 801 is cleared to zero (S50), and the count value of the hand position counter circuit 804 is also cleared to zero (S51), thereby completing the measurement time display process (S52).

If the B-button 52 is pressed during the measurement time display process, the chronograph input determination circuit 66 outputs the CG split signal. If the CG split signal is output, the count value latch circuit 802 of the measurement counter circuit 80 continues to hold the count value without updating the count value. Therefore, even if the internal counter circuit 801 counts up, the count value of the count value latch circuit 802 is not updated. Accordingly, the non-coincidence signal is not output from the coincidence determination circuit 803. Therefore, the motor drive pulse is not output from the forward drive pulse generation circuit 72, and the CG second hand 21 and the CG minute hand 31 stop. In this manner, the split time is displayed.

Then, if the B-button 52 is pressed again, the chronograph input determination circuit 66 outputs a CG split releasing signal. If the CG split releasing signal is output, the count value latch circuit 802 restarts to update the count value. At this time, the count value of the internal counter circuit 801 and the count value of the hand position counter circuit 804 are deviated from each other by a time from when the CG split signal is output until the CG split releasing signal is output. Therefore, until the count value of the hand position counter circuit 804 reaches the count value of the internal counter circuit 801 (count value of the count value latch circuit 802), the coincidence determination circuit 803 outputs the non-coincidence signal. At this time, the coincidence determination circuit 803 outputs the non-coincidence signal at an interval of 1/85.3 seconds. Therefore, the CG second hand 21 and the CG minute hand 31 move clockwise as much as one step per 1/85.3 seconds, and move forward fast to a position for indicating the measurement time. At this time, in a case where the measurement time can be displayed faster if the CG second hand 21 and the CG minute hand 31 are moved counterclockwise, the respective CG hands 21 and 31 may be moved counterclockwise.

If the A-button 51 is pressed during the measurement time display process, the chronograph input determination circuit 66 outputs a CG stop signal. If the CG stop signal is output, the reference signal generation circuit 69 stops generating the clock signal. In this manner, the internal counter circuit 801 stops counting, and the CG second hand 21 and the CG minute hand 31 stop.

If the B-button 52 is pressed in this state, the chronograph input determination circuit 66 outputs a CG reset signal. If the CG reset signal is output, the OR circuit 805 outputs a clear signal. The count value of the internal counter circuit 801 is cleared to zero, and the internal counter circuit 801 stops counting.

If the count value of the internal counter circuit 801 is cleared to zero, the coincidence determination circuit 803 outputs the non-coincidence signal until the count value of the hand position counter circuit 804 reaches zero. At this time, the coincidence determination circuit 803 outputs the non-coincidence signal at an interval of 1/85.3 seconds. Therefore, the CG second hand 21 and the CG minute hand 31 move clockwise one step by one step per 1/85.3 seconds, and move forward fast until both of these respectively indicate the zero second position and the zero minute position. At this time, in a case where the zero second position and the zero minute position can be indicated faster if the CG second hand 21 and the CG minute hand 31 are moved counterclockwise, the respective CG hands 21 and 31 may be moved counterclockwise.

Operation Effect of Embodiment

According to the electronic timepiece 1, the movement of the CG second hand 21 in a case of displaying the remaining capacity is different from the movement of the CG second hand 21 in a case of displaying the measurement time. Accordingly, based on the movement of the CG second hand 21, a user can easily recognize that the CG second hand 21 displays the remaining capacity.

It is not necessary to provide a dedicated indicating hand for displaying the remaining capacity. Therefore, it is possible to reduce the number of indicating hands and the number of stepping motors.

The CG second hand 21 moves clockwise in a case of displaying the measurement time. Accordingly, in a case of displaying the remaining capacity, the CG second hand 21 moves counterclockwise to the reference position. In this manner, the user more easily recognizes that the CG second hand 21 displays the remaining capacity rather than the measurement time.

The remaining capacity is displayed by the CG second hand 21 out of the CG second hand 21 and the CG minute hand 31 which are driven by the common CG hand stepping motor 4. Accordingly, compared to a case of using the CG minute hand 31, it is possible to shorten a time from when the operation unit is caused to perform the capacity display operation until the operation unit is caused to display the remaining capacity.

The reference position is set to a position farthest from the zero second position. Therefore, a user can more easily recognize that the CG second hand 21 indicates the reference position.

The measurement time and the remaining capacity can be displayed by using the internal counter circuit 801, the hand position counter circuit 804, and the coincidence determination circuit 803 which are employed in common. Therefore, when the measurement time is displayed and the remaining capacity is displayed, compared to a case where a separate counter circuit is provided, a circuit scale of the electronic timepiece 1 can be minimized. In this manner, a size of the control circuit 100 can be minimized, and the manufacturing cost can be reduced.

The measurement time and the remaining capacity can be displayed without using a component such as an expensive microcontroller. Therefore, the cost for the electronic timepiece 1 can be reduced.

When a user views the electronic timepiece 1, the indicating position of the CG second hand 21 in a case where the remaining capacity is sufficient is located above the indicating position of the CG second hand 21 in a case where the remaining capacity is insufficient. Accordingly, compared to the opposite case, a user can easily and intuitively recognize whether the remaining capacity is sufficient or insufficient.

Another Embodiment

The invention is not limited to the above-described embodiment. Modification and improvements within the scope which can achieve an advantage of some aspects of the invention are included in the invention.

In the above-described embodiment, if the indicator display process starts, the CG second hand 21 moves counterclockwise from the zero second position, but the invention is not limited thereto. That is, the CG second hand 21 may move clockwise from the zero second position. In this case, the CG second hand 21 moves counterclockwise after moving to the reference position.

In the above-described embodiment, after moving to the reference position, the CG second hand 21 moves by switching the rotation direction, and displays the remaining capacity. However, the invention is not limited thereto. For example, after stopping a fixed period of time in a state of indicating the reference position, the CG second hand 21 may move in the same rotation direction, and may display the remaining capacity. That is, the CG second hand 21 may be moved so as to enable a user to recognize that the CG second hand 21 indicates the reference position.

In the above-described embodiment, the remaining capacity is displayed by the CG second hand 21, but the invention is not limited thereto. For example, in a case where the CG second hand 21 and the CG minute hand 31 are driven by each individual stepping motor, the remaining capacity may be displayed by the CG minute hand 31.

However, in a case where the electronic timepiece includes multiple CG hands, the remaining capacity is displayed by the indicating hand which can move fastest. In this manner, it is possible to minimize a time from when the operation unit is caused to perform the capacity display operation until the operation unit is caused to display the remaining capacity.

In the present embodiment, the electronic timepiece 1 includes the CG second hand 21 and the CG minute hand 31. However, since the CG second hand 21 can move faster than the CG minute hand 31, the CG second hand 21 is caused to display the remaining capacity. For example, in a case where the electronic timepiece 1 includes a CG 1/5 second hand or a CG 1/20 second hand, these CG hands may be used so as to display the remaining capacity.

In the above-described embodiment, the reference position indicated by the CG second hand 21 in the indicator display process is set to the position of 30 seconds, but the invention is not limited thereto. For example, the reference position may be set to the position of 15 seconds or the position of 45 seconds. For example, in a case where a symbol indicating the reference position is marked on the outer periphery of the first small window 20, the reference position may be set to any other second position.

Although it is preferable that the reference position is different from the zero second position, the reference position may be set to the same position as the zero second position. In this case, after the CG second hand 21 is caused to revolve once, the CG second hand 21 indicates the reference position (zero second position).

Without being limited to the range from the direction of 7 o'clock to the direction of 9 o'clock when viewed from the rotary axle of the CG second hand 21, a position of the symbol 24 serving as the power indicator can be appropriately set in accordance with the reference position.

In the above-described embodiment, in the indicator display process, if the count value of the internal counter circuit 801 reaches 31, the count value of the internal counter circuit 801 is cleared to zero. That is, the predetermined count value in the invention is zero according to the above-described embodiment, but the invention is not limited thereto. That is, the predetermined count value may be a value which does not coincide with the count value of the hand position counter circuit 804 until the CG second hand 21 moves from the reference position and indicates the position corresponding to the remaining capacity.

In the above-described embodiment, the power generator is configured to include the solar panel, but the invention is not limited thereto. That is, the invention may employ an AC generator which generates electric power in accordance with movement of a rotary spindle or rotation of the crown 53.

The entire disclosure of Japanese Patent Application No. 2015-238810, filed Dec. 7, 2015 is expressly incorporated by reference herein.

What is claimed is:

1. An electronic timepiece comprising:
a power generator that generates electric energy;
a power storage that stores the electric energy;
a capacity detector that detects remaining capacity of the power storage;
an operation unit;
an operation detector that detects a measurement display operation relative to the operation unit for displaying a measurement time, and a capacity display operation relative to the operation unit for displaying the remaining capacity;
an indicating hand that is used in displaying the measurement time and the remaining capacity;
a drive unit that drives the indicating hand; and
a display controller that controls the drive unit to display the measurement time by moving the indicating hand from a preset initial position, in a case where the measurement display operation is detected, and that controls the drive unit to display the remaining capacity by moving the indicating hand from a preset reference position after moving the indicating hand to the preset reference position, in a case where the capacity display operation is detected, the preset reference position being different from the present initial position.

2. The electronic timepiece according to claim 1, wherein in a case where the display controller causes the indicating hand to display the remaining capacity, the display controller displays the remaining capacity by moving the indicating hand clockwise after moving the indicating hand counterclockwise so as to indicate the reference position.

3. The electronic timepiece according to claim 1, wherein the indicating hand is one of multiple indicating hands that display the measurement time, and the indicating hand is the fastest movable hand of the multiple indicating hands.

4. The electronic timepiece according to claim 1, wherein the indicating hand is a chronograph second hand which revolves once in 60 seconds, and wherein the display controller causes the indicating hand to indicate a position of 30 seconds as the reference position.

5. The electronic timepiece according to claim 1, wherein the display controller includes:
a reference signal generation circuit that generates a reference signal;
an internal counter circuit that counts the reference signal;
a hand position counter circuit that indicates a position of the indicating hand; and
a coincidence determination circuit that causes the hand position counter circuit to perform counting, and that outputs a control signal for operating the indicating hand, in a case where a count value of the internal counter circuit and a count value of the hand position counter circuit do not coincide with each other,
wherein in a case where the measurement display operation is detected, the internal counter circuit is caused to count the reference signal, and the coincidence determination circuit is caused to output the control signal so as to move the indicating hand and to display the measurement time,
wherein in a case where the capacity display operation is detected, until the count value of the internal counter circuit reaches a reference value corresponding to the reference position, the internal counter circuit is caused to count the reference signal, and the coincidence determination circuit is caused to output the control signal so as to move the indicating hand and to indicate the reference position,
wherein after the count value of the internal counter circuit reaches the reference value, the count value of the internal counter circuit is set to a predetermined count value so as to cause the coincidence determination circuit to output the control signal and to move the indicating hand, and
wherein if the count value of the hand position counter circuit reaches a predetermined value corresponding to the remaining capacity, the coincidence determination circuit is caused to stop outputting the control signal so as to stop the indicating hand and to display the remaining capacity.

6. A display control method of an electronic timepiece including a power generator that generates electric energy, a power storage that stores the electric energy, an operation unit, an indicating hand that is used in displaying a measurement time and remaining capacity of the power storage, the method comprising:
detecting the remaining capacity;
detecting a measurement display operation relative to the operation unit for displaying the measurement time;

detecting a capacity display operation relative to the operation unit for displaying the remaining capacity;

displaying the measurement time by moving the indicating hand from a preset initial position, in a case where the measurement display operation is detected; and displaying the remaining capacity by moving the indicating hand from a preset reference position after moving the indicating hand to the preset reference position, in a case where the capacity display operation is detected, the preset reference position being different from the preset initial position.

* * * * *